(12) United States Patent
Geng et al.

(10) Patent No.: US 7,235,478 B2
(45) Date of Patent: Jun. 26, 2007

(54) POLYMER SPACER FORMATION

(75) Inventors: Quain Geng, San Jose, CA (US); Jeff Junhao Xu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 11/034,788

(22) Filed: Jan. 12, 2005

(65) Prior Publication Data

US 2006/0154477 A1    Jul. 13, 2006

(51) Int. Cl.
    *H01L 21/4763* (2006.01)
(52) U.S. Cl. ............... 438/634; 438/675; 438/739; 438/700; 438/695; 257/E21.569
(58) Field of Classification Search ............ 438/675, 438/739, 424, 700, 695, 634
    See application file for complete search history.

(56) References Cited

U.S. PATENT DOCUMENTS

| | | | |
|---|---|---|---|
| 6,077,786 A * | 6/2000 | Chakravarti et al. ........ 438/695 |
| 6,537,866 B1 * | 3/2003 | Shields et al. ............. 438/183 |
| 6,562,696 B1 * | 5/2003 | Hsu et al. ................... 438/424 |
| 6,833,949 B2 * | 12/2004 | Maier et al. ................ 359/355 |
| 2002/0179570 A1 * | 12/2002 | Mathad et al. ............... 216/67 |
| 2005/0019693 A1 * | 1/2005 | Jung et al. ................ 430/270.1 |
| 2005/0106888 A1 * | 5/2005 | Chiu et al. .................. 438/710 |
| 2005/0233584 A1 * | 10/2005 | Jeon et al. .................. 438/675 |

* cited by examiner

*Primary Examiner*—Chandra Chaudhari
*Assistant Examiner*—Victor V. Yevsikov
(74) *Attorney, Agent, or Firm*—Blakely, Sokoloff, Taylor & Zafman LLP

(57) ABSTRACT

A polymer spacer material may increase the dimensions of the patterned photoresist that is used as a mask to etch the layers below the photoresist, which in turn translates into smaller dimensions etched into the underlying materials. This allows for the formation of integrated circuits having smaller features, smaller overall size, and greater density of features. In particular, the use of a polymer spacer material allows for the formation of contacts within flash memory cells having decreased dimensions so that higher density flash memory cells may be created without causing shorts between contacts or shorts due to misalignment of the contacts. Additionally, the use of the polymer spacer material extends the use of photolithography technologies that are used to form the patterns into the photoresists.

25 Claims, 9 Drawing Sheets

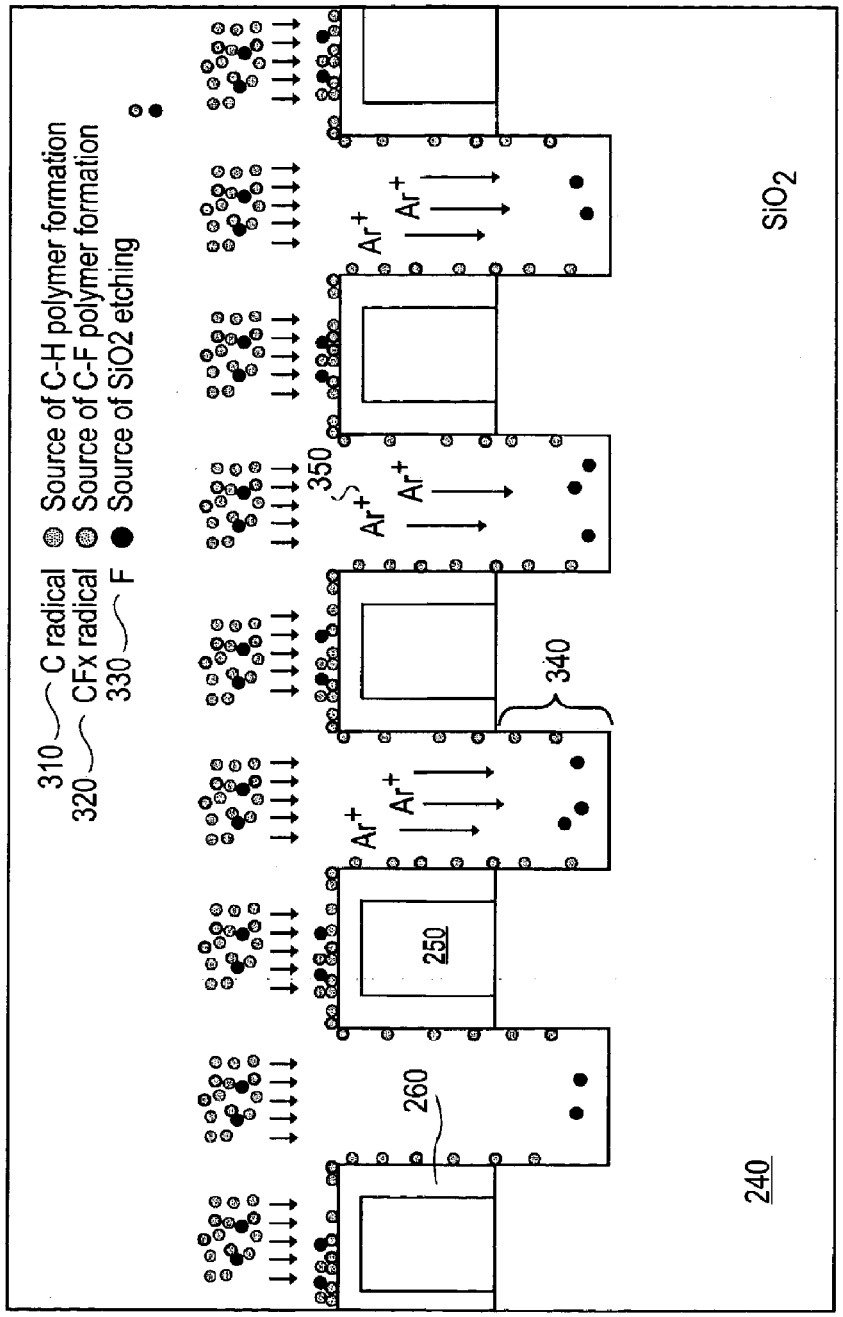

POLYMER SPACER FORMATION

BACKGROUND OF THE INVENTION

1. Field of the Invention

The present invention relates to the field of the fabrication of flash memory cells, and more particularly to the patterning and etching of materials used in the fabrication of flash memory.

2. Discussion of Related Art

Individual features of microelectronic devices are becoming increasingly small in order to increase device density, and reduce overall device size. In particular, the dimensions of flash memory chips are being decreased. FIGS. 1a–1c illustrate different views of a flash memory array. FIG. 1a illustrates a partial overhead view of a flash memory array illustrating the placement of the source regions 110 and drain regions 120 of the floating gate transistors formed within the array and the placement of the source contacts 130 and the drain contacts 140. FIG. 1b illustrates a cross-sectional view along A—A of FIG. 1a. FIG. 2c illustrates a cross-sectional view along B—B of FIG. 1a. There are far fewer source contacts 130 than drain contacts 140. This is because there is a drain contact 140 for each drain region 120 that is shared by two floating gates 150, as illustrated in the cross-sectional view in FIG. 1b, and there is one source contact 130 that is shared among many floating gates 150. As the dimensions of the flash array are decreased, the drain contacts 140 become closer and closer together. The center-to-center distance, or "pitch" 160, between the drain contacts 140 currently cannot be etched to have a 150 nm pitch or smaller pitch due to the limitations of the resolution and depth of focus capabilities of the photolithography techniques used to pattern the drain contacts 140 as in FIG. 1c. To achieve 150 nm pitch drain contact dimensions, the width of the drain contacts 140 must be at least 80 nm or less. Currently, it is not possible using the current photolithography techniques to form contacts having a width less than 100 nm for a contact array of less than 150 pitch. The width of contacts is currently limited to approximately 100 nm by the use of 193 nm wavelength light. Moving the drain contacts 140 closer together without also decreasing the dimensions of the drain contacts 140 leads to shorts 105 between the contacts 140 as illustrated in FIG. 1d. Also, misalignment of the photoresist patterning must also be taken into account because the misalignment will cause shorts 115 between the drain contacts 140 and the first metal layer (M1) 125, as illustrated in FIG. 1e, and the misalignment may also cause more than one drain contact 140 to contact the drain region 120 as illustrated at 135 in FIG. 1e.

BRIEF DESCRIPTION OF THE DRAWINGS

FIG. 3 is an illustration of a cross-sectional view of the process of depositing a polymer spacer material on a photoresist concurrent to etching a silicon dioxide layer underlying the photoresist according to an embodiment of the current invention.

DETAILED DESCRIPTION OF THE PRESENT INVENTION

Described herein are methods of using a polymer spacer to increase the dimensions of a photoresist to etch smaller dimensions in the material underlying the photoresist. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

A polymer spacer material may decrease the spacing of a patterned photoresist that is used as a mask to etch the layers below the photoresist, which in turn translates into smaller dimensions etched into the underlying materials. This allows for the formation of integrated circuits having smaller features, smaller overall size, and greater density of features. In particular, the use of a polymer spacer material allows for the formation of contacts within flash memory cells having decreased dimensions so that higher density flash memory cells may be created without causing shorts between contacts or shorts due to misalignment of the contacts. Additionally, the use of the polymer spacer material extends the use of photolithography technologies that are used to form the patterns into the photoresists.

Figure 1A:
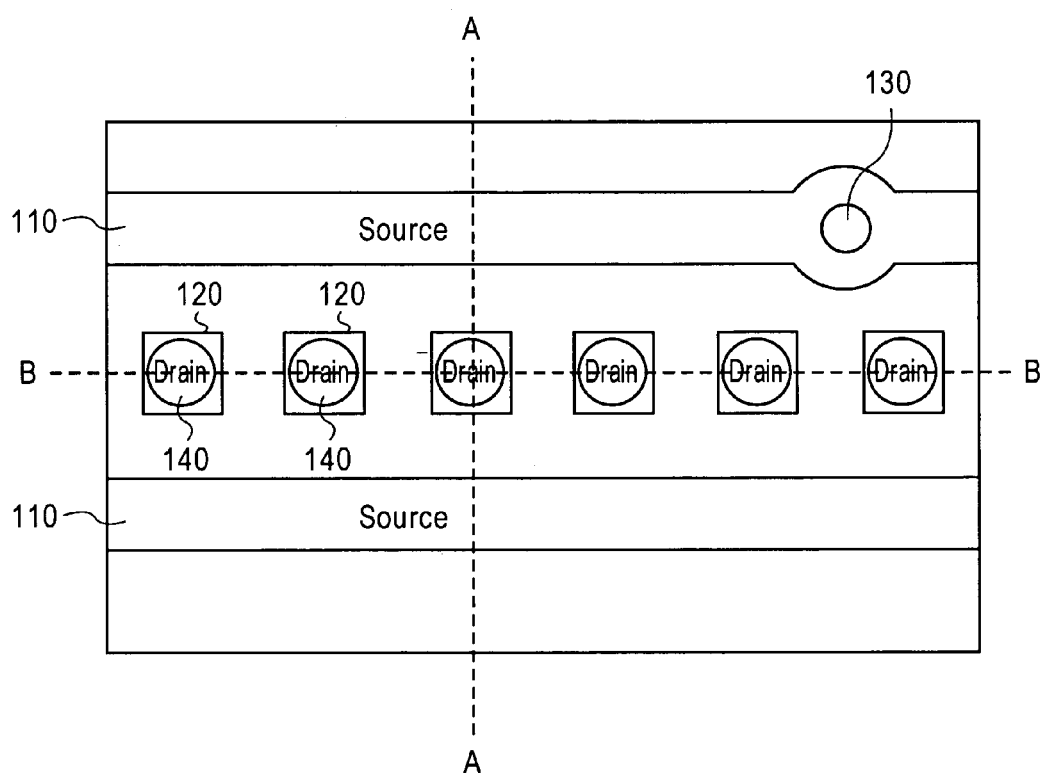
FIGS. 1a–1e illustrate various views of a flash memory array.
Figure 1B:
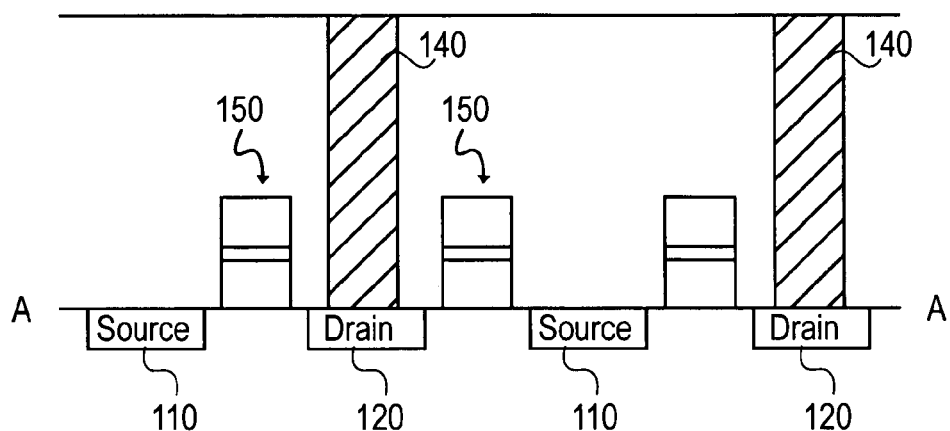
Figure 1C:
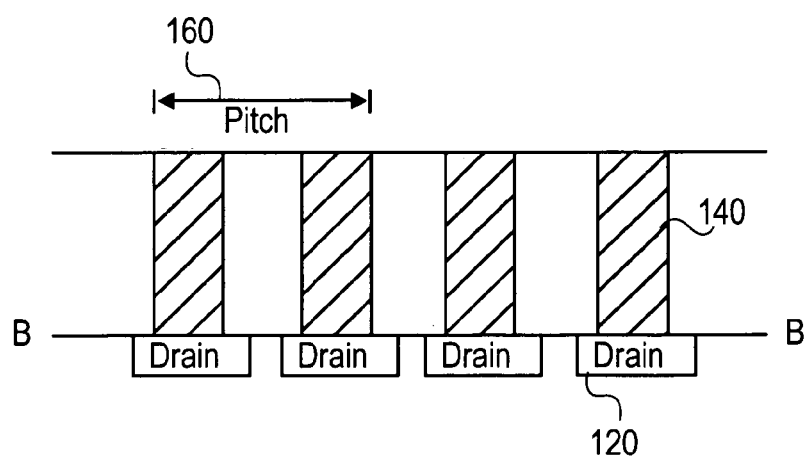
Figure 1D:
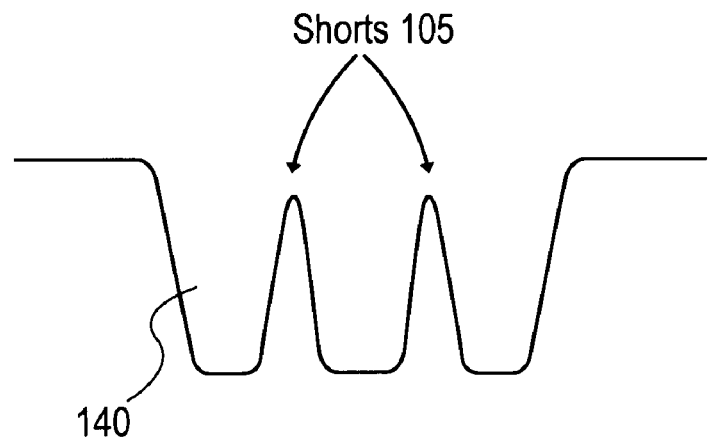
Figure 1E:
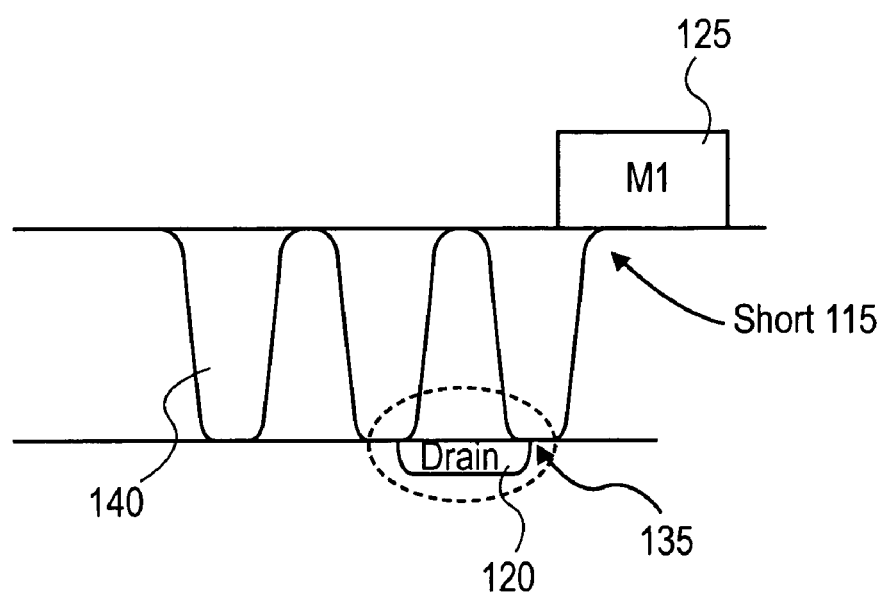
Figure 2A:
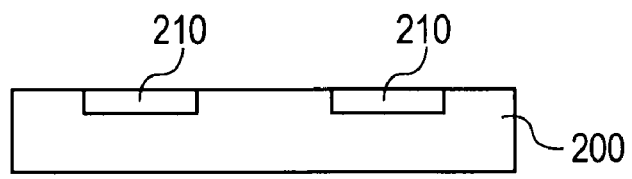
FIGS. 2a–2l illustrate a cross-sectional view of the processes involved in forming contacts in a flash memory array according to an embodiment of the current invention.
Figure 2B:
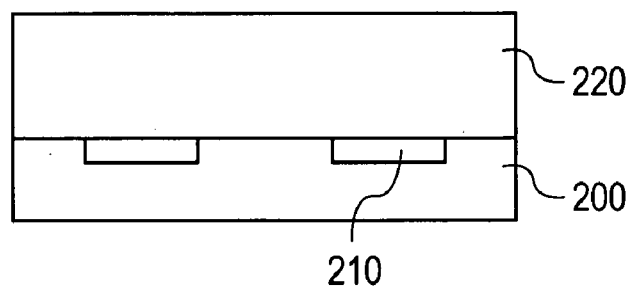
Figure 2C:
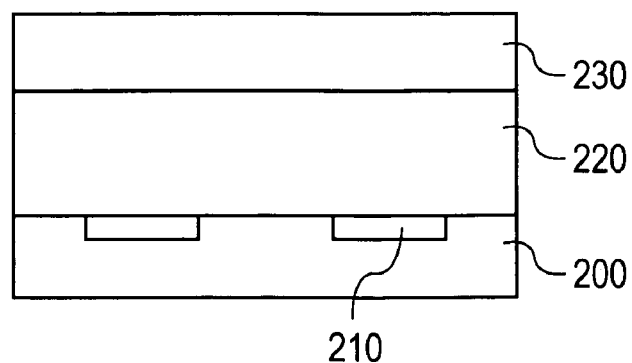
Figure 2D:
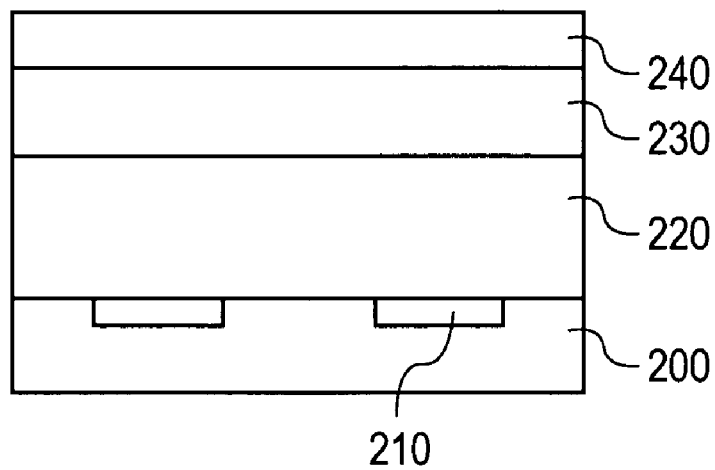

FIG. 2a illustrates a semiconductor substrate 200 in which drain regions 210 have been formed. The semiconductor substrate 200 may be monocrystalline silicon, germanium, gallium arsenide, silicon-over-insulator (SOI) or silicon-over-sapphire. Over the semiconductor substrate 200, a bulk dielectric layer 220 is deposited in FIG. 2b. The bulk dielectric layer 220 may be formed by a spin-on process, chemical vapor deposition (CVD), physical vapor deposition (PVD), atomic layer deposition (ALD), or sputtering. In an embodiment, the dielectric layer 220 may be silicon dioxide having a thickness in the approximate range of 3250 Å and 7250 Å, and more particularly 5250 Å. In an embodiment, hard masks may be formed above the dielectric layer 220. A first hard mask 230 is formed above the dielectric layer 220 in FIG. 2c. The first hard mask 230 is formed of a material that is not etched by the same etchants that may be used to etch the dielectric layer 220. The first hard mask 230 may be amorphous carbon having a thickness in the approximate range of 700 Å and 1800 Å, and more particularly approximately 1300 Å. An amorphous carbon first hard mask 230 may be formed by a spin-on process, CVD, PVD, ALD, or sputtering. In FIG. 2d, a second hard mask 240 is formed over the first hard mask 230. The second hard mask 240 is formed of a material that is not etched by the same etchants that may be used to etch the first hard mask 230. The second hard mask 240 may be silicon dioxide or silicon oxy-nitride having a thickness in the approximate range of 400 Å and 500 Å.

Figure 2E:
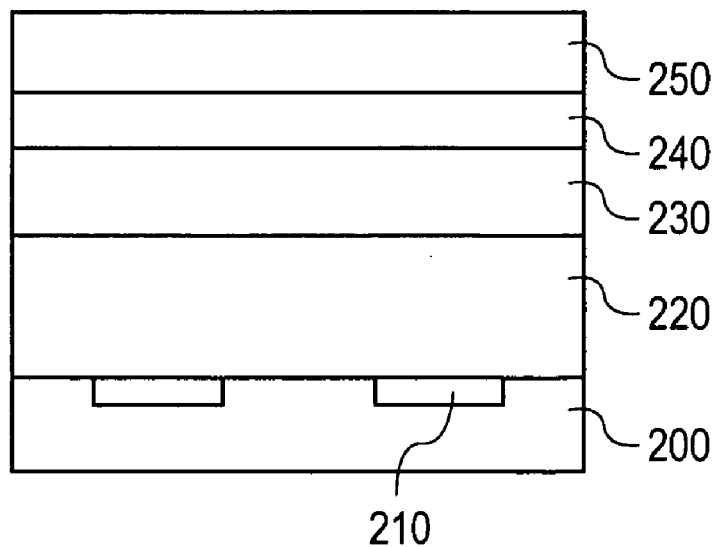
Figure 2F:
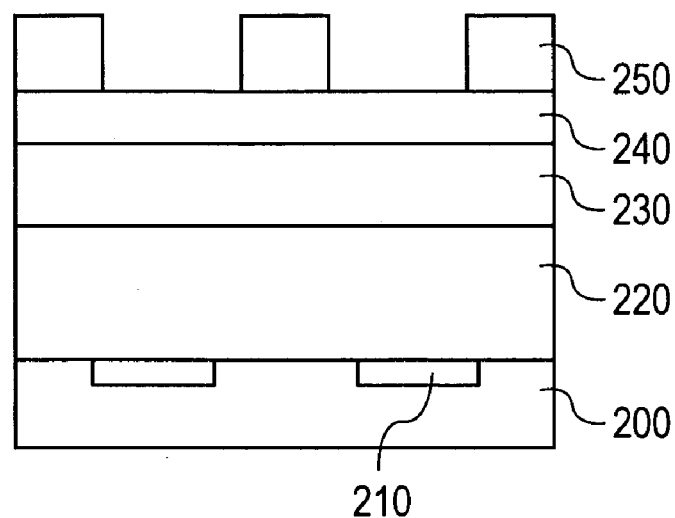

A photoresist 250 is then formed over the second hard mask 240 in FIG. 2e. The photoresist 250 is a hydrocarbon-based polymer to which the hydrocarbon-based polymer spacer material will adhere. The photoresist 250 is a chemically amplified photoresist that will change solubility in a developing fluid once irradiated. The photoresist 250 may be formed to a thickness in the approximate range of 900 Å and 1300 Å by spin coating. The photoresist 250 is then irradiated to change the solubility of the irradiated portions of the photoresist 250. The irradiation may be light having wavelengths in the UV (ultraviolet), DUV (deep ultraviolet), or EUV (extreme ultraviolet) ranges. In particular, to form the drain contacts in a flash memory array, the light may have a wavelength of approximately 193 nm to form openings having a minimum width of approximately 100 nm. In another embodiment, where vias are formed, the wavelength of the light used to pattern the photoresist may be approximately 248 nm. The irradiated portions of the photoresist 250 are then removed by a developing fluid as illustrated in FIG. 2f. The embodiment above is described as using a positive tone photoresist where the irradiated portions of the photoresist are removed, but a negative-tone photoresist where the non-irradiated portions are removed to form the pattern may also be used. The pattern formed in the photoresist 250 after the developing step may be used to etch openings in the underlying bulk dielectric layer 220 for drain contacts.

Figure 2G:
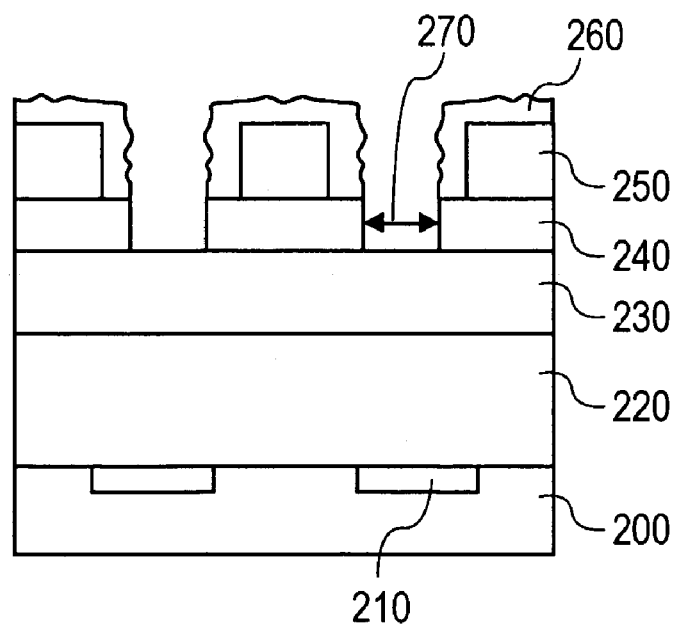

In FIG. 2g the polymer spacer material 260 is formed on all exposed horizontal and vertical surfaces of the photoresist 250 to shrink the dimensions of the pattern formed by the photoresist that will be transferred to the underlying materials by etching. Shrinking the dimensions of the pattern transferred to the underlying materials means that the dimensions of the openings in the photoresist pattern are decreased, or shrunk. The polymer spacer material 260 is applied to the hydrocarbon-based photoresist 250 by placing the substrate in a plasma chamber. In an embodiment, the polymer spacer material 260 is formed on the photoresist 250 concurrent to the etching of the second hardmask 240 exposed in the patterned regions of the photoresist 250. In this embodiment, the bulk dielectric layer 220 is not the material directly underlying the photoresist 250 because the relatively thin photoresist layer 250 having a thickness in the approximate range of 900 Å and 1300 Å may not be a sufficient mask during the etching of the bulk dielectric layer 220. A thin photoresist 250 is used when light having a wavelength in the EUV range, such as 193 nm, is used to pattern the photoresist 250 to form openings for contacts. Therefore, the pattern formed by the photoresist 250 and the polymer spacer material 260 is transferred to the second hard mask 240 that has a thickness that can be sufficiently etched using the thinner photoresist 250. In an embodiment, the second hard mask 240 may have a thickness of approximately 400 Å.

In an embodiment, where the deposition of the polymer spacer material 260 is concurrent to the etching of the second hard mask 240, the polymer spacer material 260 deposition on the photoresist 250 may be the predominant reaction. Maintaining the polymer spacer material 260 deposition as the predominant reaction in an embodiment may help ensure that the etching does not undercut the polymer spacer material 260. This may be accomplished by providing a higher concentration of the polymer spacer material 260 precursor within the plasma chamber than the etchant precursor. In this embodiment, where the second hardmask 240 is silicon dioxide, the gas precursors added to the plasma chamber are a fluorine-containing compound to provide fluorine-containing etchants and a carbon-containing compound to provide carbon that reacts with the hydrocarbon-based photoresist to form the polymer spacer material 260.

To form the polymer spacer material 260 on the photoresist at a rate such that the polymer spacer material 260 may be formed prior to etching through the second hardmask 240, the etch chamber contains an atomic ratio of a carbon source to a fluorine source in the approximate range of 150:1–50:1, and more particularly approximately 100:1. The deposition rate of the polymer spacer material 260 and the etch rate of the second hard mask 240 may be varied by changing the ratio of carbon source to the fluorine source. A lower ratio of a carbon source to a fluorine source will increase the etch rate of the second hard mask 240. A greater ratio of a carbon source to a fluorine source will increase the deposition rate of the polymer spacer material 260 onto the photoresist 250 by providing more carbon radicals to react with the photoresist to form the polymer spacer material 260. The deposition rate of the polymer spacer material 260 onto the photoresist 250 may be in the approximate range of 0.5 nm/second and 2.5 nm/second, and more particularly in the range of 1.0 nm/second and 1.5 nm/second. The etch rate of the second hardmask 240 may be in the approximate range of 1.0 nm/second and 3.0 nm/second, and more particularly in the range of 1.5 nm/second and 2.0 nm/second. The fluorine source may be fluorocarbons (CxFy) such as $CF_4$, $C_2F_6$, $C_3F_8$, $C_5F_8$, and $C_4F_6$. The source may be carbon monoxide (CO) or carbon dioxide ($CO_2$).

In one particular embodiment, the combination of a carbon source and a fluorine source may be carbon monoxide (CO) and $C_4F_8$ having an approximate ratio of 100:1. A noble gas, such as argon, may also be added to the chamber. In this embodiment, in a 13.56 MHz radio frequency plasma chamber having an approximate volume of 44 liters$^2$, the carbon monoxide (CO) may be introduced into the chamber at approximately 500 sccm and the $C_4F_8$ may be bled into the chamber at approximately 4 sccm. In this embodiment, the deposition rate of the polymer spacer material 260 onto the hydrocarbon-based photoresist 250 may be approximately 1.0 nm/second and the etch rate of the silicon dioxide second hard mask 240 may be approximately 2.0 nm/second.

The thickness of the layer of the polymer spacer material 260 that is formed on the photoresist 250 may be in the approximate range of 10 nm and 30 nm, and more particularly approximately 15 nm. For a photoresist that has been patterned to have the smallest practicable openings of approximately 100 nm using 193 nm wavelength light, the patterned openings in the photoresist and the width of the etched openings 270 in the second hard mask 240 may be decreased to a width of less than 100 nm, and more particularly in the approximate range of 80 nm and 40 nm. In an embodiment where the drain contacts of the flash memory array are formed to be 150 pitch, the width of the etched openings 270 patterned in the photoresist may be shrunk to 80 nm or less. In an embodiment where the drain contacts of the flash memory array are formed to have 140 pitch, the width of the etched openings 270 patterned in the photoresist may be shrunk to 70 nm or less.

The polymer spacer material 260 conformally coated on the patterned photoresist 250 as illustrated in FIG. 2g. A conformal coating is one that coats all exposed portions of the material being coated. FIG. 3 illustrates the species within the plasma chamber during the deposition and etching process. In the embodiment illustrated in FIG. 3, the polymer spacer material 260 is formed over the photoresist 250. The hardmask 240 over which the photoresist 250 has been formed is silicon dioxide. The polymer spacer material 260 is conformally coated on the patterned hydrocarbon-based photoresist 250 because the carbon radicals 310 formed within the plasma chamber react with the C—H bonds of the hydrocarbon-based photoresist 250. Because the second hard mask 240 is a material, such as silicon dioxide or silicon nitride, that may not contain hydrocarbons, the polymer spacer material 260 may not form on the second hard mask 240. The fluorine chemistry is selective to the hydrocarbon-based photoresist 250 and will etch a silicon dioxide second hard mask 240. The fluorine chemistry is selective in that it will not etch the hydrocarbon-based photoresist 250 but it will etch the silicon dioxide second hard mask 240. As illustrated in FIG. 3, the fluorine chemistry 330 is concentrated at the bottom of the etched opening 340. If a silicon nitride material is used as the second hard mask 240, then hydrogen must be included in the precursors added to the plasma chamber to etch silicon nitride. For example, $CH_xF_y$ compounds such as $CH_2F_2$ and $CHF_3$ may be added as precursors to the plasma chamber to etch silicon nitride. The fluorine-containing precursor tends to break down into compounds that are etchants by nature ($CF_3$, and F), the fluorine chemistry 330, and compounds that are likely to form polymers (CF, $CF_2$), the $CF_x$ radical 320. This decomposition of the fluorine containing compounds helps to balance the etch rate against the polymer deposition rate. Additionally, the fluorine compounds that are likely to form polymers, the CFx radicals 320, will help prevent undercutting of the polymer spacer material 260 by forming a thin polymer coating on the sidewalls of the etched opening 340, as illustrated in FIG. 3. The etching of the hard mask 240 is isotropic and thus etches in all directions. The formation of the thin coating by the CFx radicals 320 prevents the etching of the sidewalls of the opening 340. The thin fluorocarbon polymer coating formed by the CFx radicals 320 within the opening 340 occurs predominantly at or near the bottom of the opening 340. To remove the thin fluorocarbon polymer coating from the bottom of the opening, ions of a noble gas, such as argon, xenon, or helium, bombard the bottom of the opening. In FIG. 3 the noble gas ions are illustrated as argon ions 350. The bombardment by the argon ions is directional, that is, it is isotropic in the vertical direction and will etch the thin polymer coating predominantly at or near the bottom of the openings 340. The etching of the thin fluorocarbon polymer layer formed by the CFx radicals 320 at or near the bottom of the openings 340 clears the way for the fluorine chemistry 330 to etch the silicon dioxide second hard mask 240. Also, a small amount of CFx radicals 320 may form fluorocarbon polymers will become incorporated into the polymer spacer material 260. By these mechanisms the hard mask 240 is etched concurrently to the deposition of the polymer spacer material 260 onto the photoresist 250.

In an alternate embodiment, the etching of the layer underlying the photoresist and the deposition of the polymer spacer material 260 may be performed in two separate steps. In this embodiment, the polymer spacer material 260 may first be formed by bleeding only the carbon-containing precursors into the plasma chamber until the polymer spacer material 260 is coated conformally on the patterned photoresist 250 to a thickness sufficient to etch openings in the underlying hard mask 240 to meet the predetermined dimensions for the contacts. The etchant-containing precursors, such as the fluorine-containing or hydrogen-containing precursors for etching silicon dioxide and silicon nitride, respectively, may then be added to the plasma chamber to etch the openings into the second hard mask 240 using the photoresist 250 and the polymer spacer material 260 as a mask.

Figure 2H:
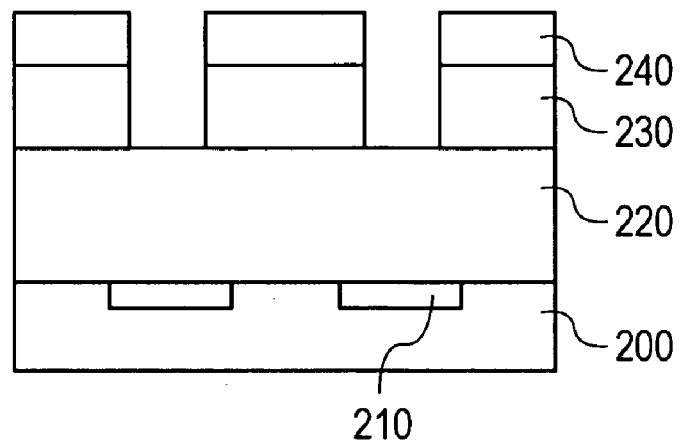

After forming the polymer spacer material 260 and etching the openings in the second hard mask 240, the polymer spacer material 260 and the photoresist 250 are removed during the etching of the first hard mask 230 as illustrated in FIG. 2h. In one particular embodiment, the first hard mask 230 is amorphous carbon and is etched using an oxygen and carbon monoxide plasma. This process may be performed in the same plasma chamber that the polymer spacer material 260 and the etching of the second hard mask 240 was performed. The second hard mask 240 serves as the mask for the etching of the underlying first hard mask 230. Because the second hard mask 240 is the mask to etch the first hard mask 230, the dimensions of the openings in the second hard mask 240 are transferred to the openings etched in the first hard mask 230. The critical dimensions of the initial etching and deposition process are therefore retained.

Figure 2I:
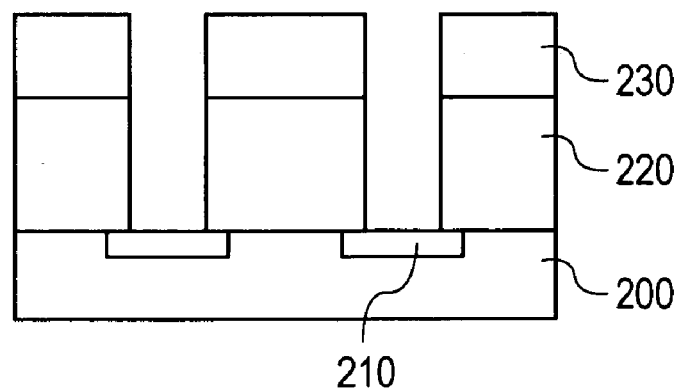
Figure 2J:
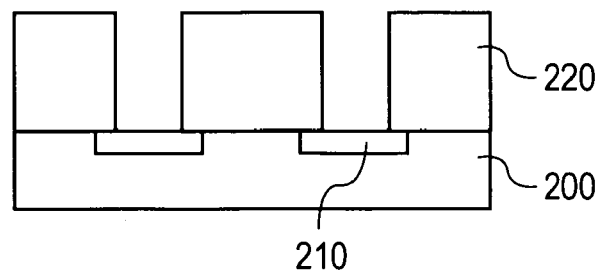

In FIG. 2i, the first hard mask 230 serves as the mask for etching the underlying bulk dielectric layer 220. The critical dimensions of the first hard mask 230 will therefore be transferred to the bulk dielectric layer 220. In an embodiment, the bulk dielectric layer is silicon dioxide. The silicon dioxide may be etched by the same fluorine-based compounds that were used above to etch the silicon dioxide second hard mask 240. For example, a plasma of the fluorine-containing compound $C_4F_6$ may be used. The etching of the bulk dielectric layer 220 may be performed in the same plasma chamber as was used for the prior etching processes. The use of amorphous carbon as the first hard mask may be valuable if the bulk dielectric layer 220 is formed of silicon dioxide because the fluorine chemistry used to etch silicon dioxide is highly selective to amorphous carbon and the critical dimensions of the patterned openings in an amorphous carbon first hard mask will be transferred to the underlying silicon dioxide layer during the etch. Openings are etched into the bulk dielectric layer 220 to the drain regions 210 formed in the semiconductor substrate 200. The first hard mask 230 is then removed by well known processes at FIG. 2j.

Figure 2K:
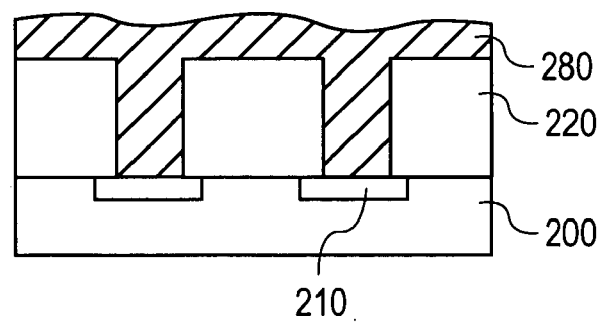
Figure 2L:
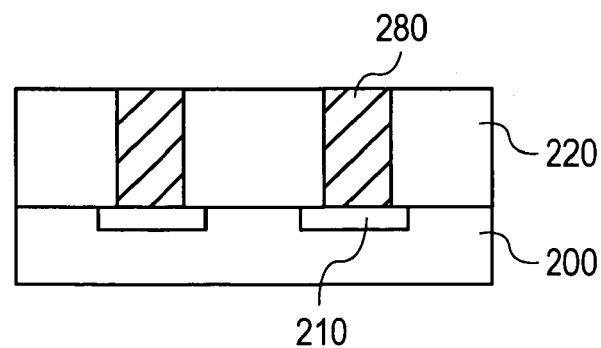

The openings in the bulk dielectric 220 are then filled with a conductive material 280 to form the drain contacts as illustrated in FIG. 2k. The method used to fill the openings with the conductive material 280 may be any well known method known to those skilled in the art, such as chemical vapor deposition or electroplating. The conductive material 280 may be titanium, titanium nickel alloy, or tungsten. The excess conductive material 280 is then removed, as illustrated in FIG. 2l, by chemical mechanical polishing (CMP) to complete the formation of the contacts.

Embodiments of the current invention may also be used to shrink the dimensions of openings in photoresists patterned to form other features within an integrated circuit, such as vias. The dimensions of the patterns formed with photoresists may therefore be decreased at any wavelength of light used to form those patterns, extending the use of processes involving higher wavelengths of light. For example, the polymer spacer material may be used with photoresists patterned with 248 nm light serve as a mask to etch vias in the circuitry above the contacts of flash memory arrays. This is because the dimensions patterned into the photoresist would no longer be limited by the resolution and depth of focus capabilities of the wavelengths of light in the photolithography technologies used. The use of the photolithography technologies may therefore be extended into the future with the use of the polymer spacer material.

Several embodiments of the invention have thus been described. However, those of ordinary skill in the art will recognize that the invention is not limited to the embodi-

We claim:

1. A method, comprising:
   patterning a photoresist directly above a dielectric layer to form a patterned photoresist;
   depositing a polymer spacer material on the patterned photoresist; and
   etching an opening into the dielectric layer using the polymer spacer as an etch mask for reducing the photoresist pattern.

2. The method of claim 1, wherein depositing the polymer spacer material on the patterned photoresist and etching the opening into the dielectric layer are concurrent.

3. The method of claim 1, wherein etching the opening in the dielectric layer comprises etching the opening in a hard mask.

4. The method of claim 3, wherein etching the opening in the dielectric layer comprises etching the opening in a silicon dioxide layer.

5. The method of claim 3, wherein etching the opening in the dielectric layer comprises etching the opening in a silicon nitride layer.

6. The method of claim 1, further comprising bombarding the opening with a noble gas to prevent deposition of the polymer spacer on a bottom of the opening.

7. The method of claim 1, further comprising allowing a thin polymer spacer coating to form on the opening sidewalls.

8. The method of claim 1, wherein depositing the polymer spacer on the patterned photoresist comprises depositing the polymer spacer conformally on the photoresist.

9. The method of claim 1, wherein depositing the polymer spacer on the photoresist and etching the opening into the dielectric layer comprises placing a substrate on which the dielectric and the photoresist are formed in a plasma etch chamber wherein the plasma etch chamber contains compounds comprising a ratio of carbon to fluorine in the approximate range of 150:1–50:1.

10. The method of claim 9, placing a substrate on which the dielectric and the photoresist are formed in a plasma etch chamber wherein the plasma etch chamber contains compounds comprising a ratio of carbon to fluorine in the approximate range of 150:1–50:1 comprises placing a substrate on which the dielectric and the photoresist are formed in a plasma etch chamber wherein the plasma etch chamber contains carbon monoxide and C4F8 comprising a ratio of carbon to fluorine in the approximate range of 100:1.

11. The method of claim 1, wherein depositing the polymer spacer on the photoresist comprises depositing a hydrocarbon-based polymer spacer material containing a small amount of fluorocarbons.

12. The method of claim 1, wherein depositing the polymer spacer on the photoresist comprises depositing the polymer spacer on a hydrocarbon-based photoresist.

13. The method of claim 1, wherein etching the opening into the dielectric layer comprises etching the opening to have a width of less than approximately 100 nm.

14. The method of claim 1, further comprising filling the openings formed in the dielectric layer with a conductive material to form contacts.

15. The method of claim 1, wherein patterning the photoresist comprises irradiating a pattern onto the photoresist with 193 nm wavelength light.

16. The method of claim 15, further comprising etching the dielectric layer to form an opening for a contact.

17. The method of claim 1, wherein patterning the photoresist comprises irradiating a pattern onto the photoresist with 248 nm wavelength light.

18. The method of claim 17, further comprising etching the dielectric layer to form a via.

19. A method, comprising:
    forming a hydrocarbon-based photoresist on a silicon dioxide dielectric layer;
    patterning the hydrocarbon-based photoresist with 193 nm light to form a patterned photoresist;
    forming a hydrocarbon-based polymer spacer material conformally coated on the patterned photoresist;
    etching an opening for a contact in the silicon dioxide dielectric layer concurrently to forming the hydrocarbon-based polymer spacer coating conformally on the patterned photoresist.

20. The method of claim 19, wherein etching the opening for the contact in the silicon dioxide layer comprises etching the opening to have a distance between vertical walls in the range of 40 nm and 80 nm.

21. The method of claim 19, wherein forming the hydrocarbon-based polymer spacer coating conformally on the patterned photoresist comprises forming the hydrocarbon-based polymer spacer to a thickness of approximately 15 nm.

22. The method of claim 19, wherein forming the hydrocarbon-based polymer spacer coating conformally on the patterned photoresist comprises forming the hydrocarbon-based polymer spacer on the patterned photoresist at a rate of approximately 1.0 nm/second.

23. A method, comprising:
    forming a photoresist above a substrate;
    patterning the photoresist to expose a plurality of exposed portions of the substrate; and
    coating the photoresist conformally with a material that is attracted to the photoresist but not attracted to the plurality of exposed portions of the substrate to decrease the dimensions of the plurality of exposed portions of the substrate beyond what is achievable with 193 nm lithographic techniques.

24. The method of claim 23, wherein coating the photoresist conformally with a material that is attracted to the photoresist but not attracted to the plurality of exposed portions of the substrate to decrease dimensions of the plurality of exposed portions of the substrate beyond what is achievable with 193 nm lithographic techniques comprises decreasing dimensions of the plurality of exposed portions to less than 100 nm.

25. The method of claim 23, wherein coating the photoresist conformally with a material that is attracted to the photoresist but not attracted to the plurality of exposed portions of the substrate to decrease dimensions of the plurality of exposed portions of the substrate beyond what is achievable with 193 nm lithographic techniques comprises decreasing dimensions of the plurality of exposed portions to within the approximate range of 40 nm and 80 nm.

* * * * *